United States Patent
Chen et al.

[19]

[11] Patent Number: 6,051,464
[45] Date of Patent: Apr. 18, 2000

[54] METHOD FOR FABRICATING A CAPACITOR OF A DRAM WITH AN HSG LAYER

[75] Inventors: Weng-Yi Chen, Chupei; Kuen-Chu Chen, Hsinchu Hsien, both of Taiwan

[73] Assignee: United Integrated Circuits Corp., Hsinchu, Taiwan

[21] Appl. No.: 09/206,064

[22] Filed: Dec. 4, 1998

[30] Foreign Application Priority Data

Aug. 18, 1998 [TW] Taiwan ................................ 87113557

[51] Int. Cl.⁷ ............................................ H01L 21/8242
[52] U.S. Cl. ............................................ 438/255; 438/665
[58] Field of Search ................................... 438/253, 254, 438/255, 396, 397, 398, 634, 665, 964

[56] References Cited

U.S. PATENT DOCUMENTS

| | | | |
|---|---|---|---|
| 5,821,142 | 10/1998 | Sung et al. | 438/255 |
| 5,837,581 | 11/1998 | Cheng | 438/255 |
| 5,933,742 | 10/1998 | Wu | 438/255 |

*Primary Examiner*—Chandra Chaudhari
*Attorney, Agent, or Firm*—Jiawei Huang; J. C. Patents

[57] ABSTRACT

A method for fabricating a capacitor including a storage capacitor of a dynamic random access memory (DRAM) starts with forming a dielectric layer and then a mask on a provided substrate, wherein the provided substrate contains a pre-formed field effect transistor (FET). By patterning the dielectric layer, a contact window is formed to expose the source/drain regions on the provided substrate. Then, a conducting layer is formed to cover the mask and fill the contact window, wherein the conducting layer is electrically connected to the source/drain region. A hemispherical-grained silicon (HSG) layer is formed on the conducting layer, wherein the silicon grains are respectively surrounded by spacers formed in a follow-up process. The HSG layer and a portion of the conducting layer are removed by performing an anisotropic etching process that uses the spacers as masks. The remains of the conducting layer, a multi-micro-cylinder structure, serves as the storage electrode of a capacitor. A dielectric layer and then, another conducting layer are formed on the multi-micro-cylinder structure after the spacers are removed.

25 Claims, 5 Drawing Sheets

METHOD FOR FABRICATING A CAPACITOR OF A DRAM WITH AN HSG LAYER

CROSS-REFERENCE TO RELATED APPLICATION

This application claims the priority benefit of Taiwan application Ser. No. 87,113,557, filed Aug. 18, 1998, the full disclosure of which is incorporated herein by reference.

BACKGROUND OF THE INVENTION

1. Field of the Invention

This invention relates to a method for fabricating a semiconductor device, and more particularly, to a method for fabricating a capacitor of a dynamic random access memory (DRAM).

2. Description of Related Art

Because microprocessors have become more and more powerful, and the structures of software applications and the performed algorithms have become more and more complicated, requirements on memory capacities have been increased accordingly. Currently, a memory cell of a DRAM normally consists of a transfer field effect transistor (TFET) and a storage capacitor. As shown in FIG. 1, a selected capacitor C of the array of capacitors on a semiconductor substrate is used to store a bit of binary data by charging and discharging the capacitor C. Normally, a binary 0 is stored in a capacitor if the capacitor is not charged, and a binary 1 is stored if the capacitor is charged. Within the capacitor C, dielectric 101 is filled into the space between the lower electrode (storage electrode) 100 and the upper electrode (cell electrode) 102 of the capacitor C to provide a required permittivity. The capacitor C is electrically connected to a bit line BL, so that data can be read or written through the bit line BL by charging or discharging the capacitor C. The task of charging or discharging the capacitor C is controlled and executed through a TFET, T, which is connected to the bit line BL on the drain, to the capacitor C on the source, and to the word line W1 on the gate. Signals are fed into the TFET T through the word line to control the connection between the capacitor C and the bit line BL.

In a conventional fabrication process of a DRAM of less than 1 megabyte in capacity, the capacitors are normally made in a two-dimension layout, a so-called planar-type capacitor. Since a conventional planar-type capacitor requires a relatively large planar area for storing charges, it is not suitable for serving in a highly integrated DRAM, such as a DRAM of larger than 4 megabytes in capacity. For the need of fabricating a highly integrated DRAM, a capacitor of a three-dimensional configuration, such as a stacked capacitor or a trench-type capacitor, is preferred.

A three-dimensional capacitor, such as a stacked capacitor or a trench-type capacitor, have been developed to store more charges without occupying a relatively large area on a semiconductor substrate as a conventional planar capacitor does. However, such a design still has certain difficulty to meet the requirement of a DRAM of higher integration and a higher capacity, such as 64 megabytes.

In order to resolve the foregoing problem, a so-called fin-type capacitor consisting of stacked and horizontally extended electrodes and dielectric has been introduced. By stacking several horizontally extended electrodes and dielectric, the total surface area of a fin-type capacitor is increased for storing more charges. More detailed description on the fabrication of a fin-type capacitor can be found in U.S. Pat. Nos. 5,071,783, 5,126,810, and 5,206,787. A research done by Ema ("3-Dimensional Stacked Capacitor Cell for 16M and 64M DRAMs", International Electronic Devices Meeting, p.p. 592–595, December 1988) is also referential.

The foregoing problems can also be resolved by extending the electrode and the dielectric layer of a capacitor vertically to form a so-called cylindrical-type capacitor. The permittivity of the capacitor is also increased according to the enlarged surface area of the capacitor electrode. More detailed description on the fabrication of a fin-type capacitor can be found in U.S. Pat. No. 5,077,688, or a research paper of Wakamita's ("Novel Stacked Capacitor Cell for 64M DRAMs", 1989 Symposium on VLSI Technology Digest of Technical Papers, p.p. 69–70, 1989).

It is obvious that downsizing a memory cell is an inevitable tendency, as the integration of semiconductor devices is further increased. However, the permittivity of a downsized storage capacitor is accordingly decreased, that is, the capacitor stores less charges. That increases the possibility of the occurrence of soft errors due to the incident α ray. Hence, people skilled in this art are still looking for a efficient fabricating method and more reliable structure of a DRAM cell in order to downsize the DRAM cell, and in the meantime, retain the permittivity of a storage capacitor as well.

SUMMARY OF THE INVENTION

It is therefore an objective of the present invention to provide a method for fabricating a capacitor having a required permittivity and a smaller planar size.

It is another an objective of the present invention to provide a method for fabricating a capacitor to improve the tolerance of the fabrication process and the fabrication yield.

In accordance with the foregoing and other objectives of the present invention, the method of the invention for fabricating a capacitor starts with forming a dielectric layer and then a mask on a provided substrate, wherein the provided substrate contains a pre-formed field effect transistor (FET). By patterning the dielectric layer, a contact window is formed to expose the source/drain regions on the provided substrate. Then, a conducting layer is formed to cover the mask and fill the contact window, wherein the conducting layer is electrically connected to the source/drain region. A hemispherical-grained silicon (HSG) layer is formed on the conducting layer, wherein the silicon grains are respectively surrounded by spacers formed in a follow-up process. The HSG layer and a portion of the conducting layer are removed by performing an anisotropic etching process that uses the spacers as masks. The remains of the conducting layer, a multi-micro-cylinder structure, serves as the storage electrode of a capacitor. A dielectric layer and then, another conducting layer are formed on the multi-micro-cylinder structure after the spacers are removed. The method of the invention can be used for fabricating capacitors including a capacitor of a dynamic random access memory (DRAM) to improve fabrication tolerance, and certainly, the fabrication yield.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for fabricating a capacitor, such as a storage capacitor of a dynamic random access memory (DRAM). FIGS. 2A through 2F are schematic cross-sectional views illustrating the method of fabricating a capacitor of a DRAM in a preferred embodiment according to the invention.

Figure 1:
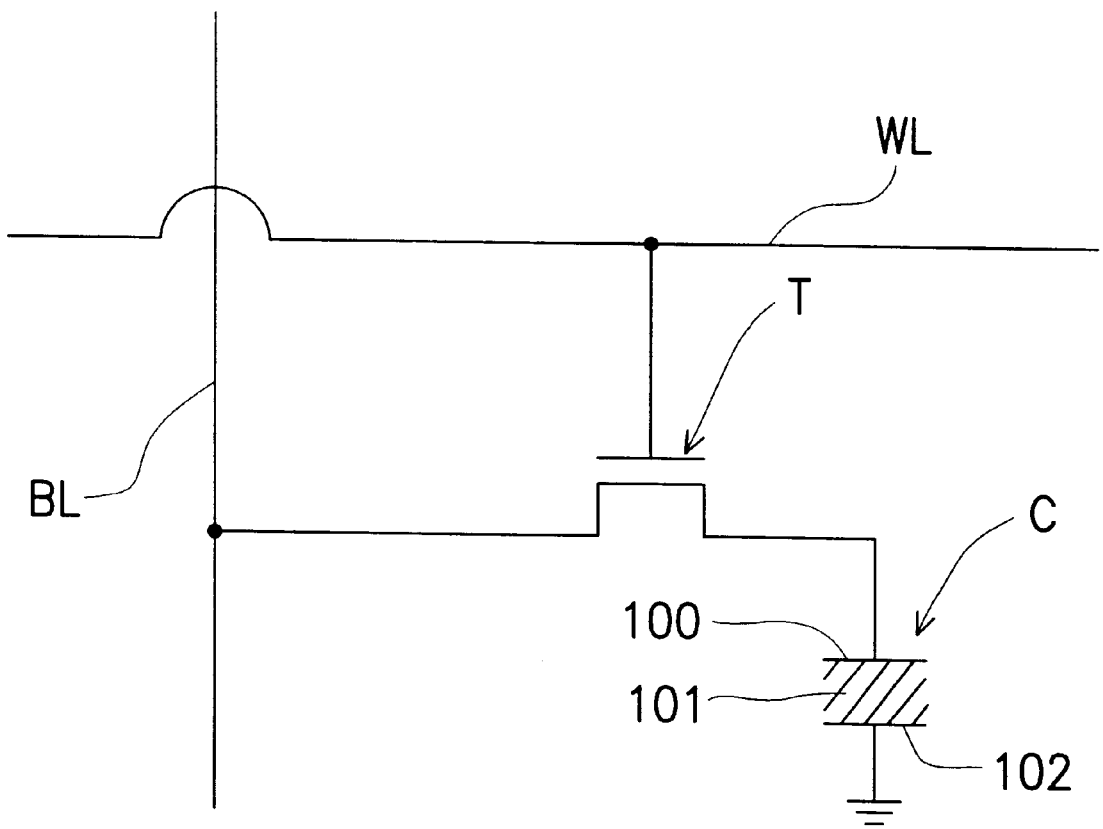
FIG. 1 is a schematic diagram showing the circuit of a memory cell in a dynamic random access memory (DRAM)
Figure 2A:
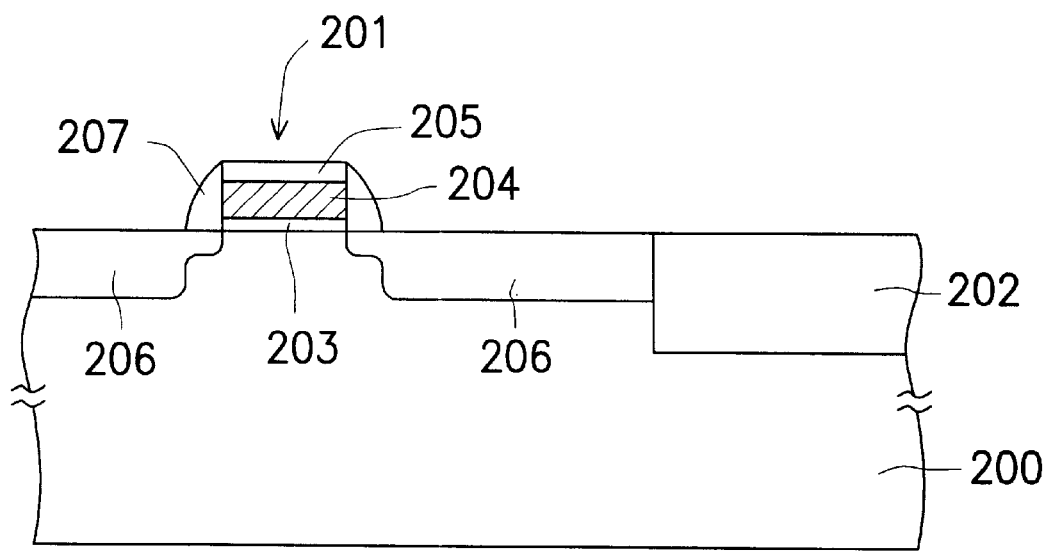
FIGS. 2A through 2F are schematic cross-sectional views showing the steps of fabricating a capacitor of a DRAM in a preferred embodiment according to the invention.

As shown in FIG. 2A, a provided substrate 200, such as P-type silicon, contains devices, for example, a field isolation 202 and a field effect transistor (FET) 201. The formation of the field isolation can be performing a local oxidation (LOCOS) process, a shallow-trench isolation process, or other process capable of achieving the same purpose. The FET 201 mainly consists of doped source/drain regions 206 in the substrate 200, and a gate structure. The gate structure contains a gate oxide layer 203, a gate 204, and a cap layer 205 stacked on the substrate 200 in sequence, and surrounded by a spacer 207.

Figure 2B:
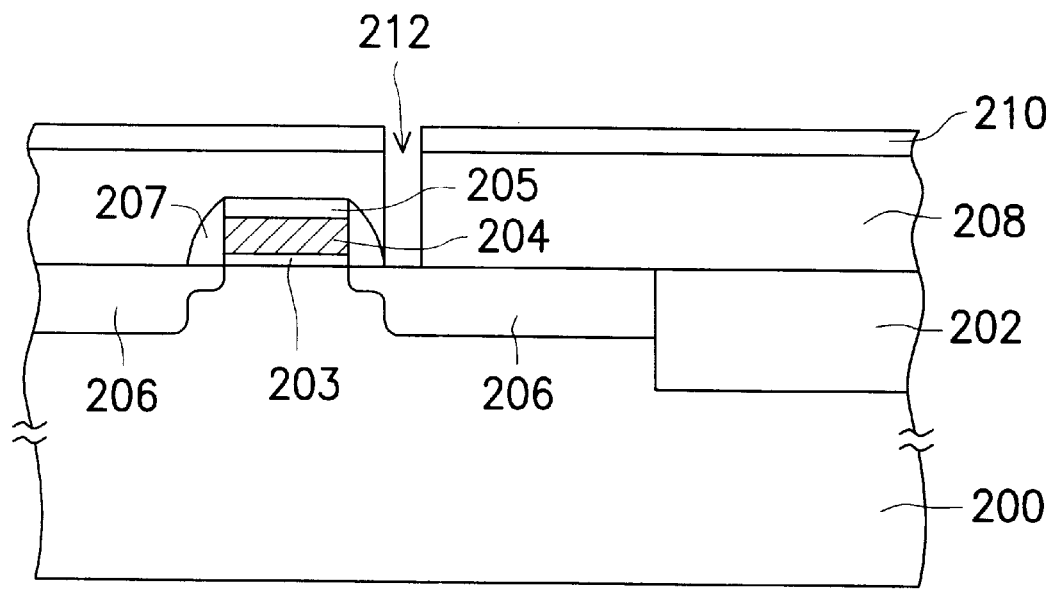

Referring to FIG. 2B, a dielectric layer 208, such as silicon oxide or boronphosphosilicate glass (BPSG), is formed on the substrate 200 by performing a process like chemical vapor deposition. Then, an etching stop layer 210, which has an etching rate different from what of the dielectric layer 208, is formed on the dielectric layer 208, and is patterned. The etching stop layer can be silicon nitride ($SiN_x$) or silicon oxynitride ($SiO_yN_x$) formed by chemical vapor deposition, or other material formed by a process that possesses the desired property. With the presence of the etching stop layer 210, a contact window 212 that exposes the source/drain regions 206 is formed on the dielectric layer by performing an etching process.

Figure 2C:
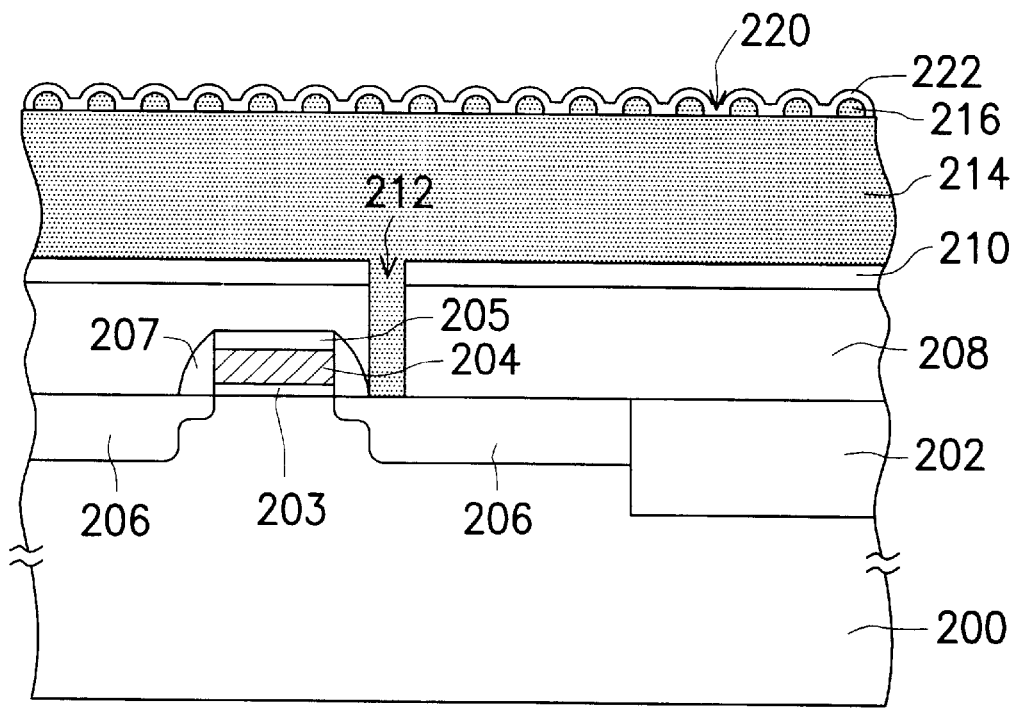

Referring next to FIG. 2C, a conducting layer 214 is formed on the etching stop layer 210 and filled in the contact window 212 as well, wherein the conducting layer 214 is electrically connected to the source/drain regions 206 through the contact window 212. The conducting layer can be polysilicon of chemical vapor deposition. In order to further raise the conductivity of the conducting layer 214, dopant is implanted into the polysilicon, wherein the dopant can be an N-type ion. A hemispherical-grained silicon (HSG) layer 216 is then formed on the conducting layer 214. The process of forming the HSG layer 216 can be a high-temperature reaction of gasiform silicon alkyl or silicon dimethyl performed within a highly vacuumed chamber followed by an annealing process at a temperature of about 550° C. to 660° C. in vacuum. The conductivity of the HSG layer 216 is further improved by implanting dopants such as arsenic into the HSG layer 216. Then, an insulator 222 is formed to cover the HSG layer 216, wherein the etching rate of the insulator 222 is different from the etching rate of the HSG layer 216. In addition, the etching rate of the insulator 222 is different from what of the etching stop layer 210 as well. The insulator includes can be a silicon oxide layer formed by performing a low-pressure chemicalvapor deposition process with gasiform tetrathylorthosilicate (TEOS) as a reactant.

Figure 2D:
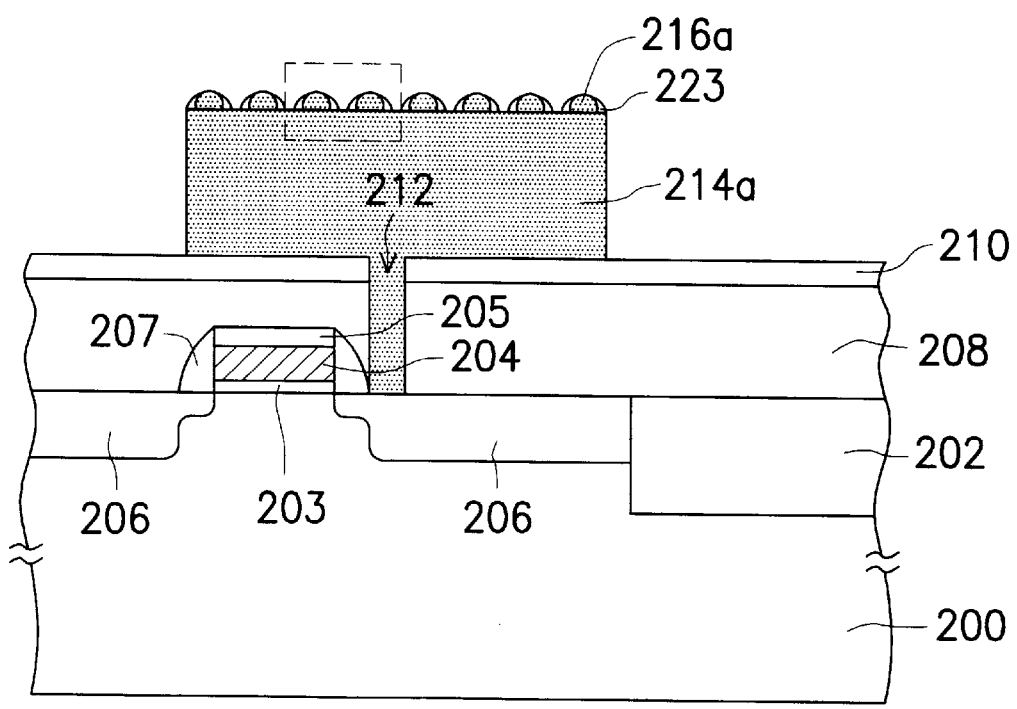
Figure 3:
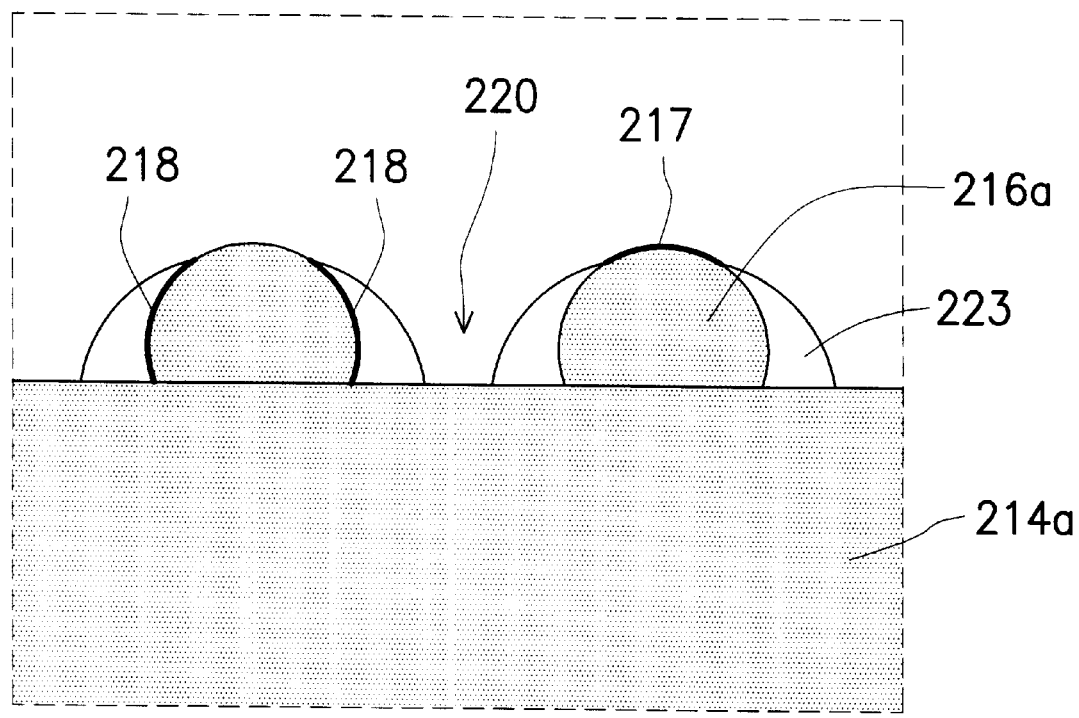
FIG. 3 is a schematic cross-sectional view showing a local detail of FIG. 2D.

Referring next to FIG. 2D together with FIG. 3, the insulator 222, the HSG layer 216, and the conducting layer 214 are patterned with a pre-determined pattern by performing a conventional etching process and employing the etching stop layer 210 as a etching stop layer. Then, by performing an etching back process on the insulator 222, the remaining insulator 222 forms a spacer 223 around the sidewall 218 of each individual silicon grain on the HSG layer 216a respectively, wherein the top 217 of each silicon grain 216a is exposed as shown in FIG. 3. Because the etching rate of the insulator 222 is different from what of the etching stop layer 210, the devices covered by the etching stop layer 210 are protected by the etching stop layer 210 from being etched away.

As shown in FIG. 3, it is a remarkable specificity of the invention that the spacers 223 around different individual silicon grains on the HSG layer 216a are separated by a space 220, that is, a exposed portion on the 214a. The exposed materials including the HSG layer 216a and a portion of the conducting layer 214a are etched away by a follow-up etching process, such as an anisotropic dry etching process, to form a multi-micro-cylinder structure.

Figure 2E:
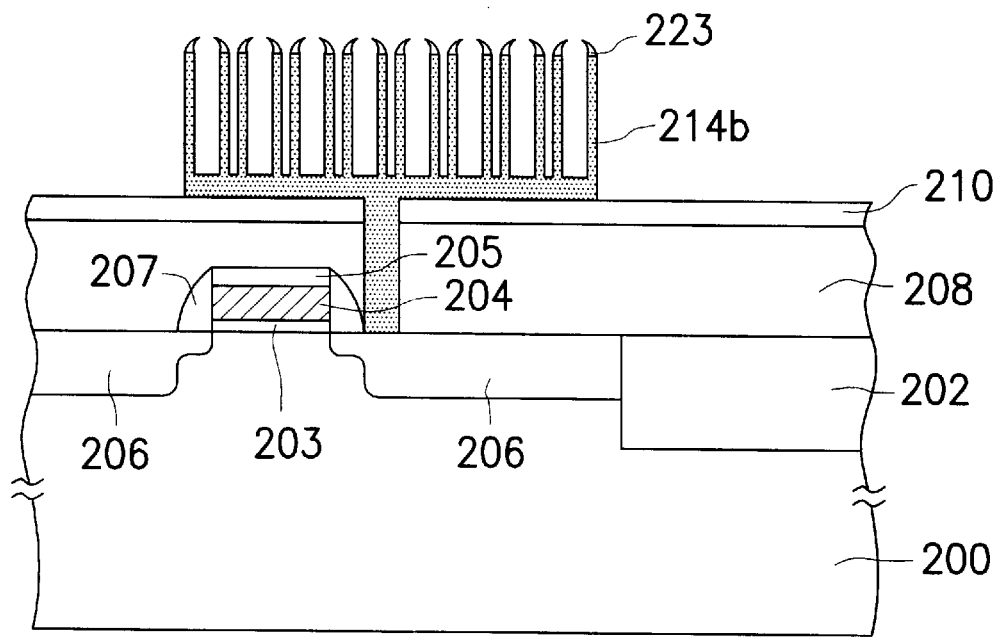

Referring to FIG. 2E, with the spacer 223 as a mask, an etching process, such as an anisotropic dry etching process, is performed to remove the exposed HSG layer 216a and the conducting layer 214a to form a multi-micro-cylinder structure.

Figure 2F:
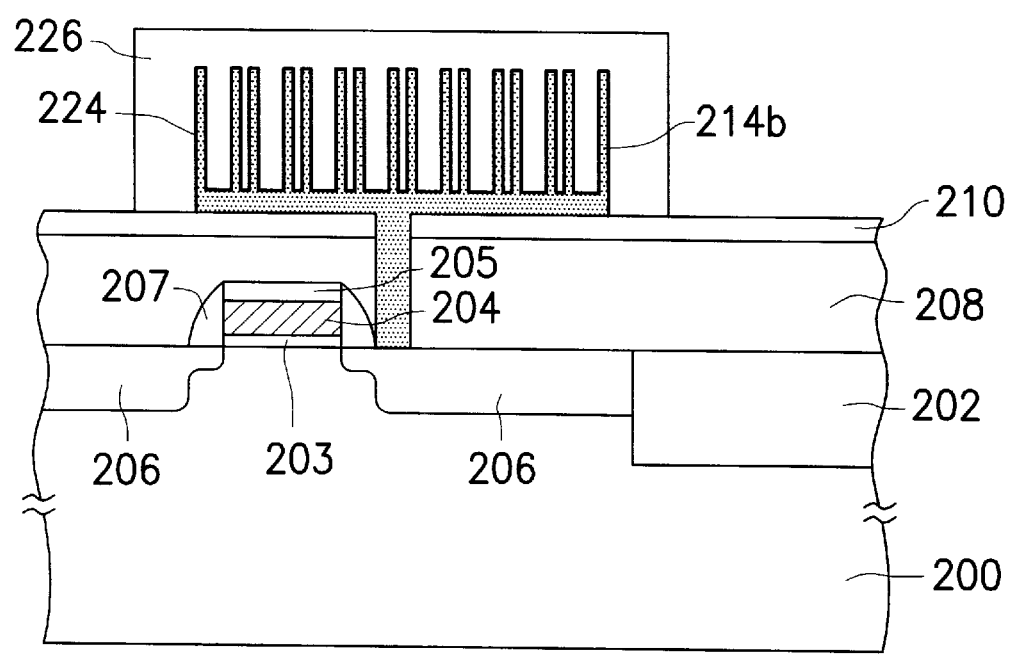

Referring next to FIG. 2F, the spacer 223 is removed from the top of the conducting layer 214b by a process such as an isotropic wet etching process of applying HF acid, wherein the conducting layer 214b is the storage electrode of the capacitor according to the invention. A dielectric film 224, and then, another conducting layer 226 are formed on the substrate 200, and patterned sequentially. The dielectric film 224 can be silicon oxide, silicon nitride/silicon oxide (NO), silicon oxide/silicon nitride/silicon oxide (ONO), $Ta_2O_5$, $Pb(Zr,Ti)O_3$ (PZT), $(Ba,Sr)TiO_3$ (BST), or other high-permittivity materials. The conducting layer 226 can be doped polysilicon formed by performing a chemical vapor deposition process, or other structures of the similar property.

Because the storage electrode of the capacitor according to the invention consists of a huge number of micro cylinders, the total surface area contributed by the micro cylinders is greatly increased on a limited area, and, so is the permittivity of the capacitor according to the invention. Compared with a conventional capacitor, the permittivity of the capacitor according to the invention is about 200% to 1000% of what of a conventional capacitor.

In addition, since the number of the micro cylinders composing the storage electrode of the invention is huge, few defect micro cylinders do not affect the performance of the storage capacitor. Hence, the method of the invention provides an easier and more defect-tolerance fabrication process of forming a capacitor.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a capacitor of a dynamic random access memory DRAM), the method comprising:
    providing a substrate, wherein the substrate contains a pre-formed field effect transistor, and wherein the pre-formed field effect transistor contains source/drain regions;

forming a dielectric layer on the substrate;

forming an etching stop layer on the dielectric layer;

patterning the etching stop layer and the dielectric layer to form a contact window to expose the source/drain regions;

forming a first conducting layer on the etching stop layer, wherein the first conducting layer covers the etching stop layer and fills the contact window, and wherein the first conducting layer is electrically connected to the source/drain regions through the contact window;

forming a hemispherical-grained silicon (HSG) layer on the first metal layer, wherein the HSG layer comprises a plurality of hemispherical silicon grains;

forming a plurality of spacers wherein each of the spacers individually surrounds one of the hemispherical silicon grains correspondingly, and wherein each of the spacers exposes a top surface of the surrounded hemispherical silicon grain, and wherein each of the spacers is separated from a neighboring one by a distance;

removing the HSG layer and a portion of the first conducting layer by using the a mask consisting of the spacers and using the etching stop layer as an etching end point;

removing the spacers;

forming a dielectric film on a exposed surface of the first conducting layer; and forming a patterned second conducting layer on the substrate.

2. The method of claim 1, wherein the etching stop layer and the HSG layer have different etching rates.

3. The method of claim 2, wherein the etching stop layer includes silicon nitride, and wherein the spacers include silicon oxide.

4. The method of claim 2, wherein the etching stop layer includes silicon oxynitride, and wherein the spacers include silicon oxide.

5. The method of claim 1, wherein the spacers and the first conducting layer have different etching rates.

6. The method of claim 5, wherein the first conducting layer includes doped polysilicon.

7. The method of claim 5, wherein the spacers include silicon oxide.

8. The method of claim 7, wherein the step of forming a plurality of spacers includes low-pressure chemical vapor deposition.

9. The method of claim 8, wherein the step of forming a plurality of spacers includes using gasiform tetrathylorthosilicate (TEOS) as a reactant.

10. The method of claim 1, wherein the step of forming a hemispherical-grained silicon (HSG) layer is proceeded at a temperature of about 550° C. to 660°.

11. The method of claim 1 wherein the step of forming a plurality of spacers comprises steps of:

forming an insulator on the HSG layer; and performing an etching back process on the insulator to form the spacers surrounding the silicon grains individually.

12. The method of claim 11, wherein the etching back process includes anisotropic etching.

13. The method of claim 12, wherein the etching back process includes dry etching.

14. The method of claim 1, wherein the step of removing the HSG layer and a portion of the first conducting layer includes anisotropic etching.

15. The method of claim 14, wherein the step of removing the HSG layer and a portion of the first conducting layer includes dry etching.

16. The method of claim 14, wherein the step of removing the HSG layer and a portion of the first conducting layer includes wet etching.

17. The method of claim 1, wherein the dielectric film is one selected from a group consisting of silicon oxide, silicon nitride/silicon oxide (NO), silicon oxide/silicon nitride/silicon oxide (ONO), and $Ta_2O_5$.

18. The method of claim 1, wherein the second conducting layer includes doped polysilicon.

19. A method for fabricating a capacitor of a dynamic random access memory (DRAM), the method comprising:

providing a substrate, wherein the substrate contains a pre-formed field effect transistor, and wherein the pre-formed field effect transistor contains source/drain regions;

forming a dielectric layer on the substrate;

forming a silicon nitride layer on the dielectric layer;

patterning the silicon nitride layer and the dielectric layer to form a contact window to expose the source/drain regions;

forming a doped polysilicon layer on the silicon nitride layer, wherein the doped polysilicon layer covers the silicon nitride layer and fills the contact window, and wherein the doped polysilicon layer is electrically connected to the source/drain regions through the contact window;

forming a hemispherical-grained silicon (HSG) layer on the doped polysilicon layer, wherein the HSG layer comprises a plurality of hemispherical silicon grains;

forming a silicon oxide layer on the HSG layer;

patterning the silicon oxide layer, the HSG layer and the doped polysilicon layer;

performing an etching back process on the silicon oxide layer to form a plurality of spacers, wherein each of the spacers surrounds one of the silicon grains individually, and wherein the spacers expose the top of the silicon grains removing the HSG layer and a portion of the doped polysilicon layer by using the a mask consisting of the spacers and using the silicon nitride layer as an etching end point;

removing the spacers;

forming a dielectric film on a exposed surface of the doped polysilicon layer; and forming a patterned conducting layer on the substrate.

20. The method of claim 19, wherein the step of forming a silicon oxide layer includes low-pressure chemical vapor deposition.

21. The method of claim 20, wherein the step of forming a silicon oxide layer includes using gasiform tetrathylorthosilicate (TEOS) as a reactant.

22. The method of claim 19, wherein the step of forming a hemispherical-grained silicon (HSG) layer is proceeded at a temperature of about 550° C. to 660°.

23. The method of claim 19, wherein the step of removing the HSG layer and a portion of the doped polysilicon layer includes wet etching.

24. The method of claim 19, wherein the dielectric film is one selected from a group consisting of silicon oxide, silicon nitride/silicon oxide (NO), silicon oxide/silicon nitride/silicon oxide (ONO), and $Ta_2O_5$.

25. The method of claim 19, wherein the conducting layer includes doped polysilicon.

* * * * *